(12) United States Patent
Ham et al.

(10) Patent No.: US 11,385,265 B2
(45) Date of Patent: Jul. 12, 2022

(54) CURRENT SENSING DEVICE

(71) Applicant: LSIS CO., LTD., Anyang-si (KR)

(72) Inventors: Seungjin Ham, Anyang-si (KR); Jinyoung Park, Anyang-si (KR); Jongmahn Sohn, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 264 days.

(21) Appl. No.: 16/619,334

(22) PCT Filed: May 3, 2018

(86) PCT No.: PCT/KR2018/005139
§ 371 (c)(1),
(2) Date: Dec. 4, 2019

(87) PCT Pub. No.: WO2018/225955
PCT Pub. Date: Dec. 13, 2018

(65) Prior Publication Data
US 2020/0116762 A1    Apr. 16, 2020

(30) Foreign Application Priority Data
Jun. 9, 2017    (KR) .................. 10-2017-0072711

(51) Int. Cl.
*G01R 15/18*    (2006.01)
*G01R 19/25*    (2006.01)
(Continued)

(52) U.S. Cl.
CPC ......... *G01R 15/186* (2013.01); *G01R 15/185* (2013.01); *G01R 19/25* (2013.01);
(Continued)

(58) Field of Classification Search
CPC .. G01R 15/181; G01R 19/0092; G01R 15/18; G01R 15/183; G01R 15/186;
(Continued)

(56) References Cited

U.S. PATENT DOCUMENTS

| 4,276,510 A | 6/1981 | Tompkins et al. |
| 7,579,824 B2 | 8/2009 | Rea et al. |

(Continued)

FOREIGN PATENT DOCUMENTS

| CN | 101178417 A | 5/2008 |
| CN | 201319314 Y | 9/2009 |

(Continued)

OTHER PUBLICATIONS

Chinese Office Action for related Chinese Application No. 201880035776.3; action dated May 7, 2021; (7 pages).
(Continued)

*Primary Examiner* — Raul J Rios Russo
(74) *Attorney, Agent, or Firm* — K&L Gates LLP

(57) ABSTRACT

A current sensing device according to the present invention may comprise: a substrate part which includes at least two base substrates stacked in one direction and through which a circuit passes in the one direction; a coil part which is formed on at least one of the base substrates and surrounds the circuit; and a core part which is disposed between the base substrates while being spaced apart from the coil part, and surrounds the circuit.

7 Claims, 9 Drawing Sheets

(51) Int. Cl.
*H05K 1/16* (2006.01)
*H01F 38/30* (2006.01)
*H01F 27/42* (2006.01)
*H01F 38/32* (2006.01)

(52) U.S. Cl.
CPC .......... *H05K 1/165* (2013.01); *H01F 27/427* (2013.01); *H01F 38/30* (2013.01); *H01F 38/32* (2013.01); *H01F 2038/305* (2013.01); *H05K 2201/086* (2013.01); *H05K 2201/09027* (2013.01)

(58) Field of Classification Search
CPC ...... G01R 19/00; G01R 15/185; G01R 21/00; G01R 19/25; H01F 2038/305; H01F 27/427; H01F 38/30; H01F 38/32; H05K 1/165; H05K 2201/086; H05K 2201/09027; H05K 2201/09063
USPC .... 324/72, 76.11–76.83, 115, 126, 127, 129, 324/149
See application file for complete search history.

(56) References Cited

U.S. PATENT DOCUMENTS

| | | | |
|---|---|---|---|
| 2004/0178875 | A1 | 9/2004 | Saito |
| 2008/0106254 | A1* | 5/2008 | Kojovic ............... G01R 15/181 336/200 |
| 2008/0218302 | A1 | 9/2008 | Volker |
| 2009/0230948 | A1* | 9/2009 | Kojovic ............... H01F 38/30 336/174 |
| 2012/0229243 | A1* | 9/2012 | Rettig ................... G08C 17/04 336/200 |
| 2013/0043967 | A1* | 2/2013 | Rouaud ................ G01R 15/181 336/200 |
| 2015/0022153 | A1 | 1/2015 | Bouchez et al. |
| 2017/0074908 | A1* | 3/2017 | Nejatali ............... G01R 15/181 |
| 2017/0328961 | A1* | 11/2017 | Lee ........................ H01L 43/12 |

FOREIGN PATENT DOCUMENTS

| | | |
|---|---|---|
| CN | 102944716 A | 2/2013 |
| CN | 104155499 A | 11/2014 |
| CN | 104169727 A | 11/2014 |
| CN | 104576005 A | 12/2014 |
| CN | 104871015 A | 8/2015 |
| JP | H08285899 A | 4/1995 |
| JP | H09113543 A | 10/1995 |
| JP | H11101824 A | 9/1997 |
| JP | 2008014921 A | 8/2006 |
| JP | 2008107119 A | 10/2006 |
| JP | 2008289267 A | 5/2007 |
| JP | 2010230457 A | 3/2009 |
| JP | 2011247699 A | 5/2010 |
| JP | 2011017618 A | 1/2011 |
| JP | 2011150899 A | 8/2011 |
| JP | 2013124875 A | 12/2011 |
| JP | 2014531018 A | 11/2014 |
| JP | 2015515844 A | 5/2015 |
| JP | 2015533420 A | 11/2015 |
| JP | 2015533424 A | 11/2015 |
| JP | 2019523415 | 8/2019 |
| KR | 20070029239 A | 3/2007 |
| KR | 101329240 B1 | 11/2013 |
| KR | 101708736 B1 | 2/2017 |
| KR | 101747076 | 6/2017 |

OTHER PUBLICATIONS

Extended European Search Report for related European Application No. 18813198.1; action dated Mar. 12, 2021 (10 pages).
Japanese Office Action for related Japanese Application No. 2019-567695; action dated Dec. 4, 2020; (3 pages).
International Search Report for related International Application No. PCT/KR2018/005139; report dated Dec. 13, 2018; (3 pages).
Written Opinion for related International Application No. PCT/KR2018/005139; report dated Dec. 13, 2018; (5 pages).
Korean Notice of Allowance for related Korean Application No. 10-2017-0072711; action dated Dec. 24, 2018; (5 pages).
Korean Office Action for related Korean Application No. 10-2017-0072711; action dated Sep. 27, 2018; (5 pages).
Chinese Notice of Allowance for related Chinese Application No. 201880035776.3; action dated Feb. 9, 2022; (7 pages).
Gong, et al.; Design and experimental study of PCB Rogowski coil current sensor; China Academic Journal Electronic Publishing House; 2017 (5 pages).
Chen, et al.; Design of Current Sensor Based on PCB Rogowski Coils; Journal of Shanghai University of Electric Power; vol. 32, No. 1; 2016; (5 pages).

* cited by examiner

CURRENT SENSING DEVICE

TECHNICAL FIELD

The present disclosure relates to a current sensing device.

BACKGROUND ART

Generally, a circuit breaker opens and closes a circuit. Here, the circuit breaker is installed on a circuit between a power source and a load. And the circuit breaker connects a circuit, or interrupts a circuit. Here, the circuit breaker analyzes a current flowing on a circuit. Through this, if a current on a circuit is a normal current, the circuit breaker connects the circuit. On the other hand, if a current on a circuit is an abnormal current, the circuit breaker interrupts the circuit.

For this, the circuit breaker includes a current sensing device for sensing a current on a circuit.

As such a current sensing device, a current transformer is generally used much. However, in case of a high-capacity circuit breaker having a large load current, a current transformer includes an iron core. This causes problems of a magnetic saturation with respect to a large current and a heat occurrence due to an iron loss. Accordingly, in a circuit breaker of a large capacity, a Rogowskii coil comparatively having no magnetic saturation is used.

The conventional current sensing device using such a Rogowskii coil includes an air core formed of an insulating material such as plastic and formed to enclose a circuit, and a coil wound on the air core and on which a current induced by a magnetic field of the circuit flows. The current sensing device may calculate the amount of a current flowing on a circuit, on the basis of a voltage signal induced by a magnetic field generated around the circuit, based on an electromagnetic induction.

However, there is a problem that a performance of the conventional current sensing device is not uniformly obtained. That is, the current sensing device may have a different performance according to its fabrication environment. The reason is because fabrication processes such as winding a coil on an air core are performed manually. As a result, a current calculated from the current sensing device has a low reliability, and a circuit breaker may malfunction.

Further, in the conventional current sensing device, since an air core is used, an output signal corresponds to several micro bolts ($\mu V$) when a rated voltage is low. This may cause a problem that an amplifying circuit should be additionally installed. Also, it was difficult to select an output signal when external noise was mixed with the signal.

DISCLOSURE

Technical Problem

An object of the present disclosure is to provide a current sensing device capable of minimizing manual procedures at the time of fabrication processes.

Another object of the present disclosure is to provide a current sensing device capable of uniformly obtaining a product performance.

Another object of the present disclosure is to provide a current sensing device capable of enhancing the reliability on a found current detection signal.

Another object of the present disclosure is to provide a current sensing device capable of preventing a malfunction of a circuit breaker where the current sensing device of the present disclosure has been installed.

Technical Solution

A current sensing device according to the present disclosure, which achieves the purposes of the present disclosure, may include: a substrate part which includes at least two base substrates stacked in one direction and through which a circuit passes in the one direction; a coil part which is formed on at least one of the base substrates, and which surrounds the circuit; and a core part which is disposed between the base substrates while being spaced apart from the coil part, and which surrounds the circuit.

According to one preferred aspect of the present disclosure, the coil part may include: a first coil part configured to attenuate a part of a magnetic field generated at the circuit; and a second coil part configured to generate a current induced from the rest of the magnetic field.

According to another preferred aspect of the present disclosure, the current sensing device may further include a compensation unit configured to apply a compensation current for compensating for a part of the magnetic field, to the second coil part.

According to still another preferred aspect of the present disclosure, the second coil part may be further configured to output a voltage corresponding to the induced current and the compensation current.

According to one preferred aspect of the present disclosure, the current sensing device may further include: an oscillation unit configured to apply a source current for driving the first coil part; and a calculation unit configured to calculate a current flowing on the circuit, based on the voltage.

Advantageous Effect

According to a preferred aspect of the present disclosure, since a core and printed circuit board (PCB) coil assembly is fabricated with a structure that the coil part is formed on the substrate part, the core and PCB coil assembly may be easily fabricated.

As the core and PCB coil assembly includes the core part, the core part may enhance a magnetic field applied to the core and PCB coil assembly, from the circuit.

Further, the current sensing device attenuates a part of a magnetic field generated at the circuit, and compensates it by a compensation current, thereby preventing a magnetic saturation due to a magnetic field. This may allow manual procedures to be minimized while the current sensing device is fabricated, and the current sensing device may have a uniform performance.

Accordingly, the reliability on a current detection signal (current detection data) detected by the current sensing device may be enhanced. Further, a malfunction of a circuit breaker due to a current detection signal may be prevented.

DETAILED DESCRIPTION OF THE INVENTION

Hereinafter, various embodiments of the present disclosure will be explained with reference to the accompanying drawings. However, this is not to limit the technique disclosed in this specification to a specific embodiment, but it should be understood that various modifications, equivalents, and/or alternatives are included. In relation to explanations of the drawings, similar components may be provided with similar reference numbers.

Terms such as "have", "may have", "include" or "may include" are used to indicate an existence of a corresponding characteristic (e.g., numbers, functions, operations, or components such as parts), and they do not exclude an existence of an additional characteristic.

The terms such as "first" or "second" may modify various elements regardless of the order and/or the importance, and are merely used to distinguish one element from another. They do not limit corresponding elements.

Figure 1:
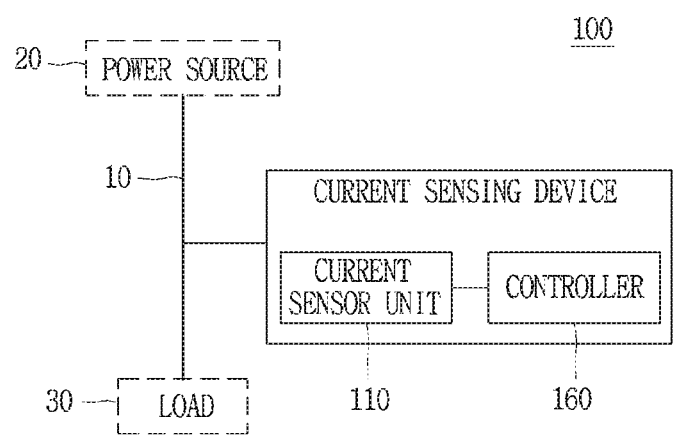
FIG. 1 is a block diagram showing an electric configuration of a current sensing device according to the present disclosure.

FIG. 1 is a block diagram showing an electric configuration of a current sensing device 100 according to a first embodiment of the present disclosure.

Referring to FIG. 1, the current sensing device 100 according to a first embodiment of the present disclosure may be arranged on a circuit 10. Here, the circuit 10 may be an electric power circuit of an electric power system (grid). The circuit 10 connects a power source 20 and a load 30 to each other, and a current may flow from the power source 20 to the load 30 along the circuit 10. Here, a primary current may be defined as the current flowing on the circuit 10. The current sensing device 100 may include a current sensor unit 110 and a controller 160.

The current sensor unit 110 may detect a secondary current based on a primary current. Here, as the primary current flows on the circuit 10, a magnetic field may be generated around the circuit 10. This may allow a magnetic field to be applied to the current sensor unit 110. And the current sensor unit 110 may detect a secondary current in correspondence to a magnetic field. The current sensor unit 110 may generate a secondary current from a magnetic field by an electromagnetic induction. That is, a secondary current may be defined as a current induced from a magnetic field.

The controller 160 may calculate a primary current based on a secondary current. Here, the controller 160 may detect a voltage based on a secondary current. And the controller 160 may calculate a primary current from a voltage. Here, the controller 160 may pre-store parameters of the current sensor unit 110, and may calculate a primary current by using them.

Figure 2:
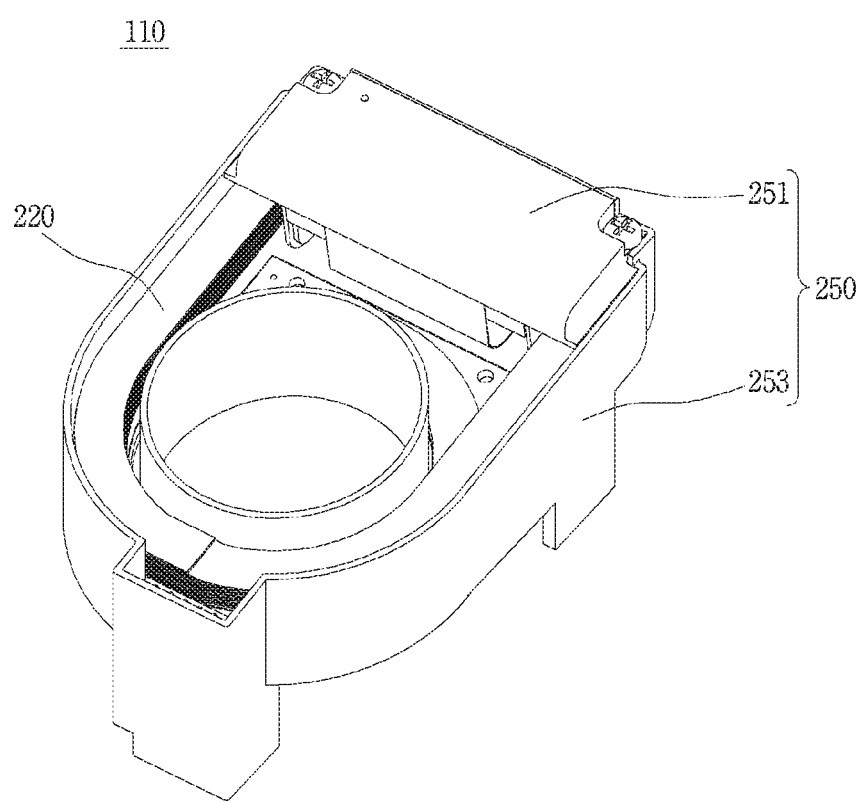
FIG. 2 is a perspective view showing an assembled state of a physical configuration of a current sensor unit in a current sensing device according to the present disclosure.
Figure 3:
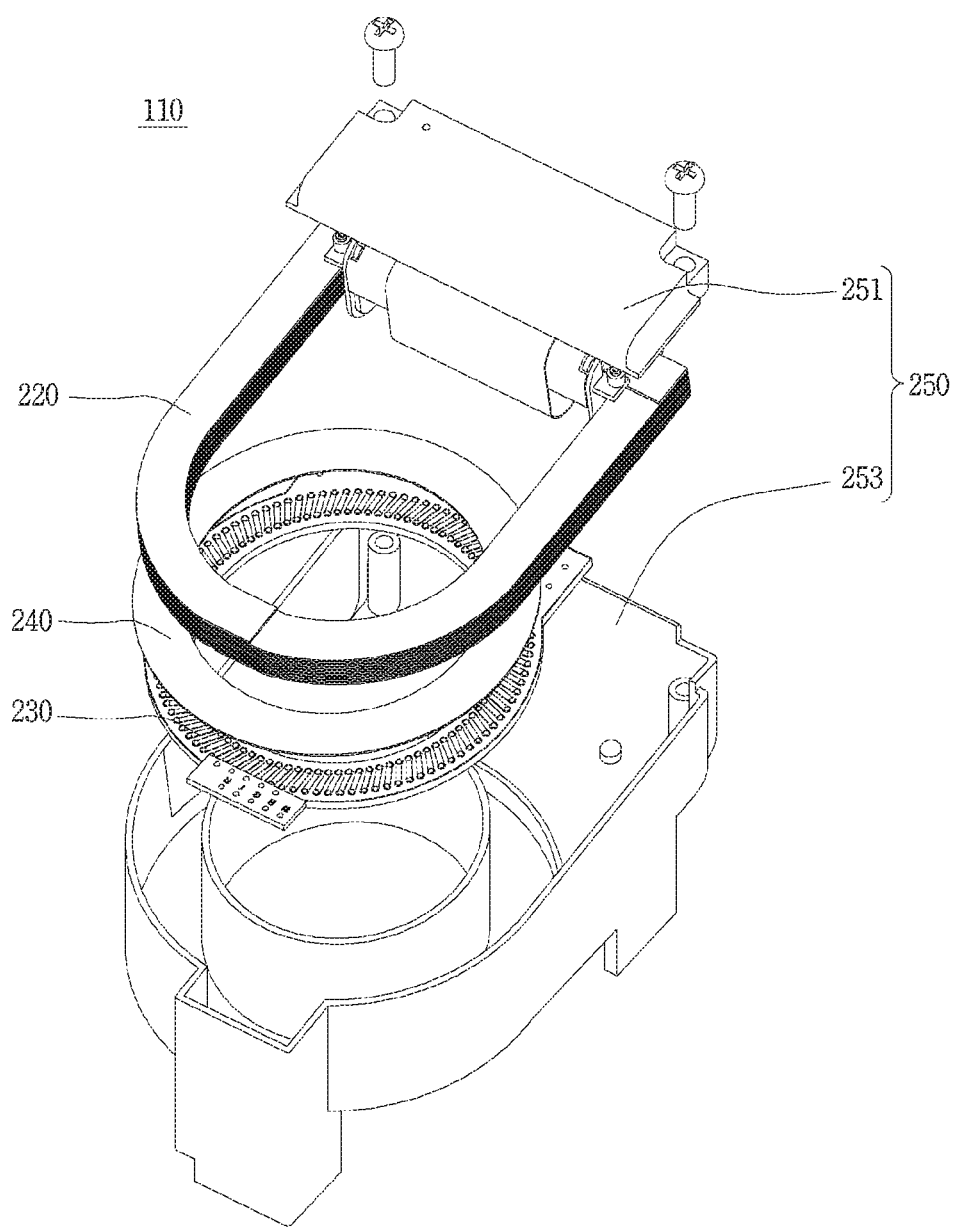
FIG. 3 is a disassembled perspective view showing a disassembled state of an assembly of the current sensor unit shown in FIG. 2.
Figure 4:
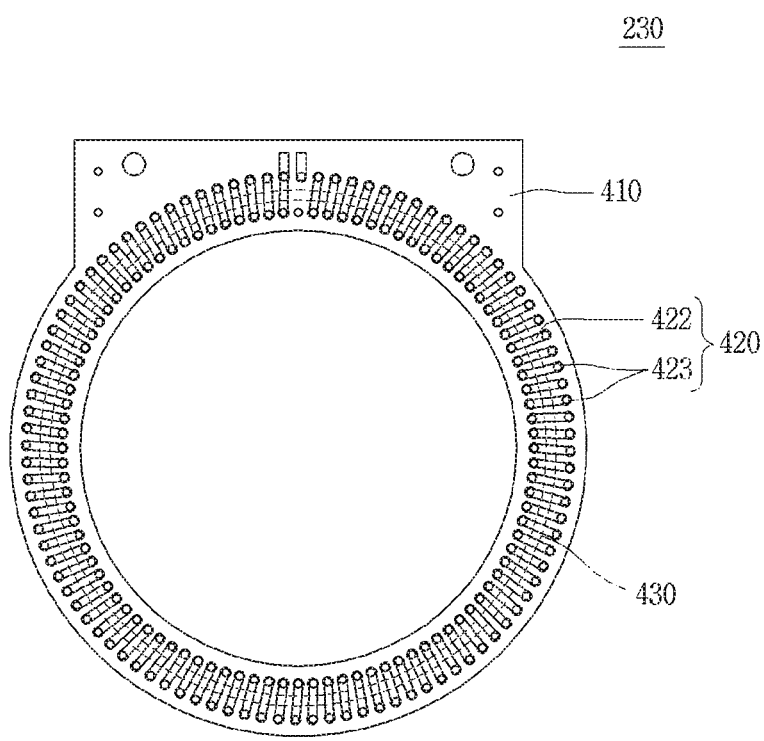
FIG. 4 is a planar view showing a core and printed circuit board (PCB) coil assembly among a current sensor unit, a major component of a current sensing device according to the present disclosure.
Figure 5:
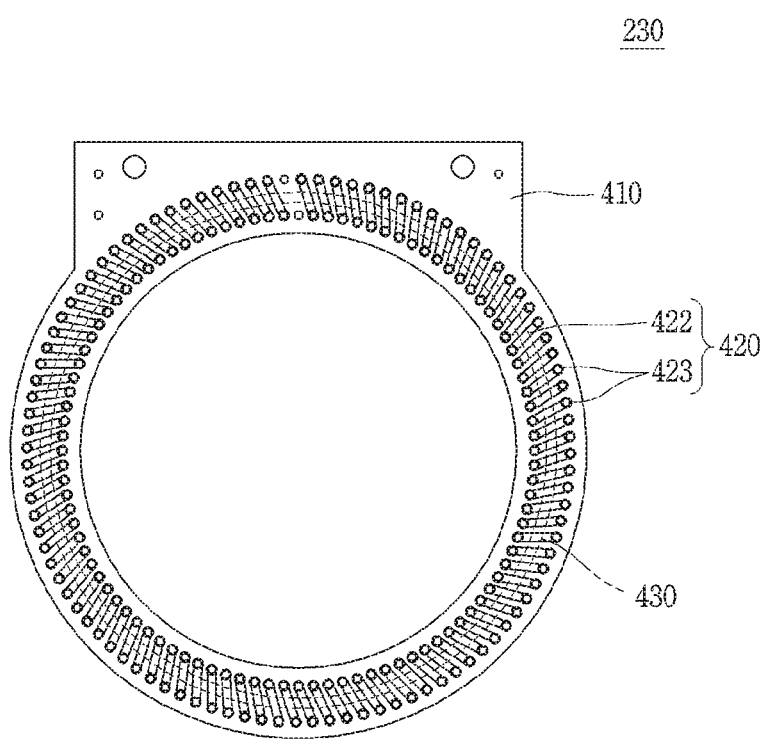
FIG. 5 is a rear view showing a rear surface of the core and PCB coil assembly shown in FIG. 4.

FIG. 2 is a perspective view showing the current sensor unit 110 according to a preferred embodiment of the present disclosure, and FIG. 3 is a disassembled perspective view showing, in a disassembled manner, the current sensor unit 110 according to a preferred embodiment of the present disclosure. FIG. 4 is a planar view showing a core and printed circuit board (PCB) coil assembly 230 among the current sensor unit 110 according to a preferred embodiment of the present disclosure. And FIG. 5 is a rear view showing the core and PCB coil assembly 230 according to a preferred embodiment of the present disclosure.

Referring to FIGS. 2 and 3, the current sensor unit 110 according to a preferred embodiment of the present disclosure may include a power source unit 220, a core and PCB coil assembly 230, an insulating member 240, and an enclosure 250. The circuit 10 may pass through the current sensor unit 110 in one direction. Here, the power source unit 220, the core and PCB coil assembly 230, and the insulating member 240 may be stacked on each other by being arranged in parallel in one direction.

The power source unit 220 may be configured as a power current transformer (power CT), and may include an iron core and a secondary winding wound on the corresponding iron core.

The iron core of the power source unit 220 may allow the circuit 10 to pass therethrough. Accordingly, the power source unit 220 may be arranged to enclose the circuit 10. This may allow a magnetic field generated from the circuit 10 to be applied to the power source unit 220. Here, the power source unit 220 may generate a source current based on a current induced by the magnetic field, according to preset parameters. And the power source unit 220 may supply the source current to the controller 160. Thus, the controller 160 may operate by consuming the source current supplied from the power source unit 220.

The core and PCB coil assembly 230 may pass the circuit 10 therethrough in one direction. And the core and PCB coil assembly 230 may enclose the circuit 10. Accordingly, a magnetic field generated by a current flowing on the circuit 10 may be applied to the core and PCB coil assembly 230. Here, the core and PCB coil assembly 230 may generate a secondary current induced by the magnetic field, in proportion to the amount of the current flowing on the circuit 10. And the core and PCB coil assembly 230 may transmit a secondary current to the controller 160. This may allow the controller 160 to calculate a primary current (i.e., a primary current amount) indicating the amount of the current flowing on the circuit 10, based on a secondary current. For instance, the core and PCB coil assembly 230 may be configured as an assembly of a core and a PCB of coil. Here, the core and PCB coil assembly 230 may be formed as a circular or polygonal ring. According to various embodiments, the core and PCB coil assembly 230 may include a substrate part 410, a coil part 420 and a core part 430, as shown in FIGS. 4 and 5.

The substrate part 410 may support the coil part 420 and the core part 430. Here, the substrate part 410 may be formed of a material having an electric insulating property. And the substrate part 410 may be formed to have a flat structure. For instance, the substrate part 410 may be formed to have a single layer, or may be formed to have multi layers. The substrate part 410 may be provided with a through hole portion at a middle part thereof, in order to pass the circuit 10 therethrough in one direction. Here, the surface of the substrate part 410 may be defined as a plane perpendicular to the one direction. The substrate part 410 may include a shielding part (not shown). The shielding part may be provided at the substrate part 410, in order to shield the core and PCB coil assembly 230, from external noise. For this, the shielding part may be applied to a side surface of the substrate part 410, or may be connected to a ground. The shielding part may be formed of a coating layer of copper and/or lead.

The coil part 420 may generate the secondary current from the applied magnetic field. For this, the coil part 420 may include a plurality of conductive pads formed as straight lines of a predetermined length, at an upper surface and a bottom surface of the substrate part 410. Here, the coil part 420 may enclose the circuit 10. And the coil part 420 may be formed on the surface of the substrate part 410, and may be formed to pass through the substrate part 410. The coil part 420 may include a plurality of conductive pad portions 422 and a plurality of connection portions 423 (via hole portions). The conductive pad portions 422 may be formed on the upper surface and/or the bottom surface of the substrate part 410. The plurality of connection portions 423 may connect one pair of conductive pad portions 422 corresponding to each other on the upper surface and the bottom surface of the substrate part 410, mechanically and electrically.

The core part 430 may provide a magnetic path where a magnetic field formed around the circuit 10 is moveable. For this, the core part 430 may be mounted to the substrate part 410. Here, the core part 430 may enclose the circuit 10. And the core part 430 may be arranged to be spaced apart from the coil part 420. That is, the core part 430 may not contact the coil part 420. Here, the core part 430 may be configured as an iron core having a small thickness of 0.1-0.5 mm and having a higher magnetic permeability than air, according to a preferred embodiment. In the present disclosure, since the core part 430 is configured as an iron core having a high magnetic permeability, a larger voltage (e.g., several millivolts or more) than a very small induced voltage corresponding to several micro bolts when the core part is configured as an air core is induced to the coil part 420. Accordingly, an amplifying circuit for amplifying a small detection signal is not required.

Further, the core part 430 may be formed as a circular or polygonal ring. The coil part 420 may be wound on the core part 430. That is, the core part 430 may be arranged at an inner region of the conductive pad portions 422, between the conductive pad portions 422 formed on a front surface and a rear surface of the substrate part 410. For instance, in a case that the plurality of connection portions 423 connect both ends of the conductive pad portions 422 formed on an upper surface and a bottom surface of the substrate part 410, the core part 430 may be arranged between the plural pairs of connection portions 423.

The insulating member 240 may be arranged between the power source unit 220 and the core and PCB coil assembly 230. This may allow the insulating member 240 to electrically separate the power source unit 220 and the core and PCB coil assembly 230 from each other. Here, the insulating member 240 may be formed of an insulating material. And the insulating member 240 may allow the circuit 10 to pass therethrough in the one direction. Also, the insulating member 240 may enclose the circuit 10.

The enclosure 250 may accommodate therein the power source unit 220, the core and PCB coil assembly 230, and the insulating member 240. And the enclosure 250 may support the power source unit 220, the core and PCB coil assembly 230, and the insulating member 240. Also, the enclosure 250 may allow the circuit 10 to pass therethrough in the one direction. The enclosure 250 may include a first enclosure 251 and a second enclosure 253. The first enclosure 251 may be arranged to face the power source 20, and the second enclosure 253 may be arranged to face the load 30. And the first enclosure 251 and the second enclosure 253 may be coupled to each other in one direction. The first enclosure 251 and the second enclosure 253 may be coupled to each other, at an outer region of the power source unit 220, the core and PCB coil assembly 230, and the insulating member 240.

According to various embodiments, a primary current may flow to the load 30 from the power source 20 along the circuit 10. Accordingly, a magnetic field may be generated around the circuit 10 based on the primary current. Here, the magnetic field may be applied to the power source unit 220 and the core and PCB coil assembly 230, of the current sensor unit 110. Here, the magnetic field may be applied to the coil part 420 of the core and PCB coil assembly 230. The power source unit 220 may generate a source current from a magnetic field, thereby supplying to the controller 160. The core and PCB coil assembly 230 may generate a secondary current from a magnetic field, thereby outputting a voltage corresponding to the secondary current to the controller 160. Here, the core part 430 may provide a magnetic movement path of a magnetic field applied to the coil part 420. This may allow the controller 160 to operate by the source current, and to calculate the amount of the primary current based on a voltage.

Figure 6:
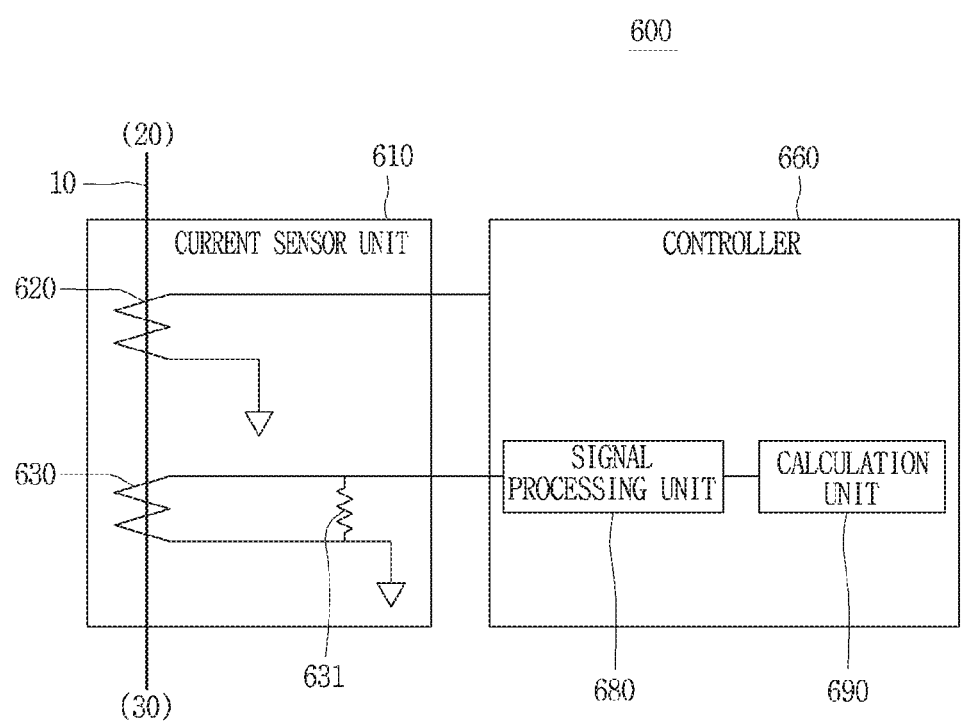
FIG. 6 is a block diagram showing an electric configuration of a current sensing device according to a first embodiment of the present disclosure.

FIG. 6 is a block diagram showing an electric configuration of a current sensing device according to a first embodiment of the present disclosure.

Referring to FIG. 6, a current sensing device 600 according to a first embodiment of the present disclosure may include a current sensor unit 610 and a controller 660. Here, a circuit 10 connects a power source 20 and a load 30, and a current may flow from the power source 20 to the load 30 along the circuit 10. Here, a primary current may be defined as the current flowing on the circuit 10.

The current sensor unit 610 may include a power source unit 620, and a core and PCB coil assembly 630. Here, the power source unit 620 and the core and PCB coil assembly 630 may be arranged in parallel to each other in one direction. And the power source unit 620 and the core and PCB coil assembly 630 may pass the circuit 10 therethrough in one direction. Also, the power source unit 620 and the core and PCB coil assembly 630 may enclose the circuit 10. This may allow a magnetic field generated at the circuit 10 to be applied to the power source unit 620 and the core and PCB coil assembly 630. The power source unit 620 may generate a source current from a magnetic field, thereby supplying to the controller 660. The core and PCB coil assembly 630 may generate a secondary current from a magnetic field. According to the first embodiment, the core and PCB coil assembly 630 may include a load (burden) 635 for providing a current detection signal as a voltage signal. The load 635 may provide a voltage formed at both ends of the load 635 to the controller, as an input signal for current measurement, in correspondence to the secondary current. Here, the load 635 may be configured as a resistance having a preset resistance value, or a capacitor.

The controller 660 may operate by using a source current of the power source unit 620. And the controller 660 may calculate the amount of a primary current flowing on the circuit 10, based on the secondary current. According to the first embodiment, the controller 660 may include a signal processing unit 680 and a calculation unit 690.

The signal processing unit 680 may convert an analogue detection signal of a secondary current outputted from the current sensor unit 610, into a digital signal.

The calculation unit 690 may calculate the amount of the primary current flowing on the circuit 10, based on the digital signal of the secondary current. That is, the calculation unit 690 may calculate the primary current based on a digital voltage signal corresponding to the secondary current. Here, the controller 660 pre-stores therein parameters of the current sensor unit 610, and the calculation unit 690 may calculate a primary current by using them. The controller 660 stores therein a voltage indicated by the digital voltage signal, and the amount of the primary current, in a mapping manner. As the calculation unit 690 selects a primary current in correspondence to the voltage, the amount (value) of the primary current may be output.

Figure 7:
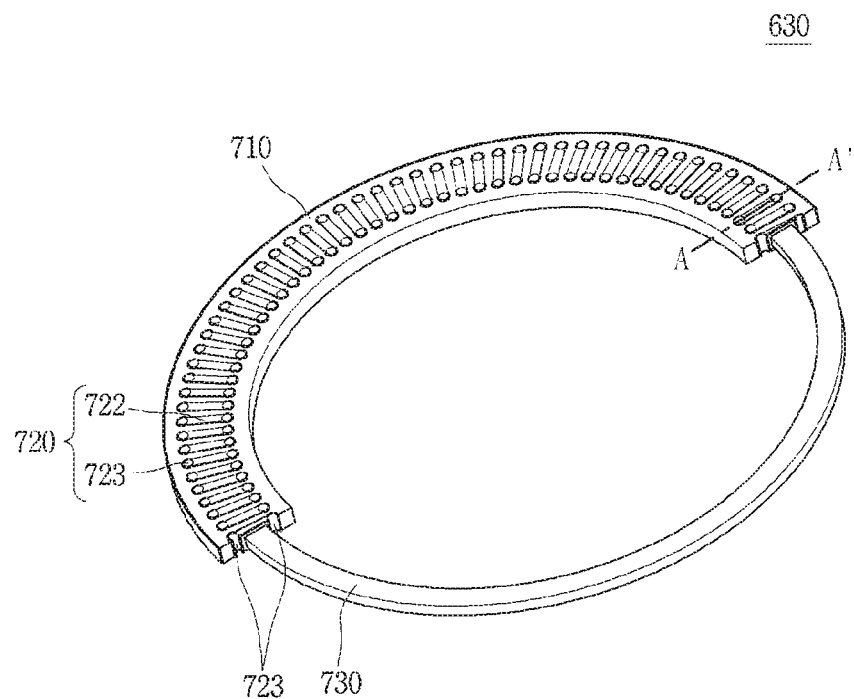
FIG. 7 is a partially-cut perspective view showing an inner configuration of the core and PCB coil assembly shown in FIG. 4 in a partially-cut manner.
Figure 8:
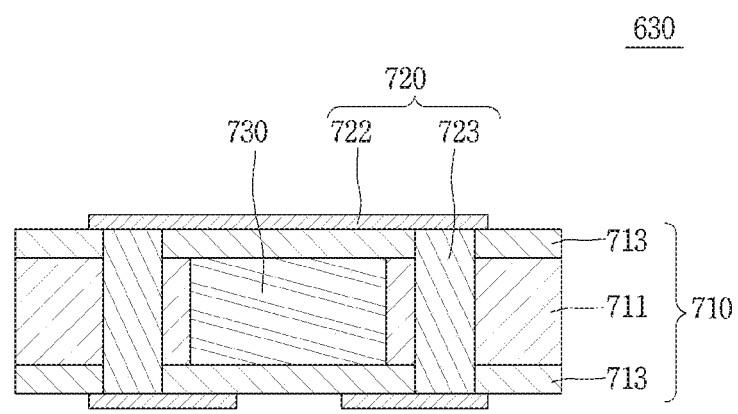
FIG. 8 is a sectional view taken along line A-A' in FIG. 7, which shows an inner configuration of a core and PCB coil assembly according to a first embodiment of the present disclosure.

FIG. 7 is a partially-cut perspective view showing an inner configuration of the core and PCB coil assembly shown in FIG. 4 in a partially-cut manner. And FIG. 8 is a sectional view showing an inner configuration of the core and PCB coil assembly 630 according to a first embodiment of the present disclosure. Here, FIG. 8 is a sectional view taken along line A-A' in FIG. 7.

Referring to FIGS. 7 and 8, the core and PCB coil assembly 630 according to a preferred embodiment of the present disclosure may include a substrate part 710, a coil part 720 and a core part 730. Here, FIG. 7 shows a state that the substrate part 710 and the coil part 720 have been removed from a partial region of the core and PCB coil assembly 630. For instance, the core and PCB coil assembly 630 may be implemented as a PCB.

The substrate part 710 may support the coil part 720 and the core part 730. Here, the substrate part 710 may be formed of an electric insulating material. The substrate part 710 may include a plurality of base substrates 711, 713. The base substrates 711, 713 may be stacked on each other in one direction. Here, each of the base substrates 711, 713 may be formed to have a flat structure. For instance, each of the base substrates 711, 713 may be formed to have a single layer, or may be formed to have multi layers. The base substrates 711, 713 may include the first base substrate 711, and the second base substrates 713 mounted to both side surfaces (an upper surface and a bottom surface in FIG. 7) of the first base substrate 711.

The coil part 720 may generate a secondary current from an applied magnetic field. For this, the coil part 720 may be mounted to the substrate part 710. Here, the coil part 720 may be formed of a conductive material such as copper. The coil part 720 may include conductive pad portions 722 and connection portions 723. The conductive pad portions 722 may be mounted (printed) to (on) the surface of the substrate part 710. Here, the conductive pad portions 722 may be mounted to the second base substrates 713, on the opposite side to the first base substrate 711. The connection portions 723 may pass through the substrate part 710. And the connection portions 723 may connect the conductive pad portion 722 corresponding to the upper base substrate 713, to the conductive pad portion corresponding to the lower base substrate 713, in FIG. 8. Here, the connection portions 723 may pass through the first base substrate 711 and the second base substrates 713. For instance, any two of the connection portions 723 may be connected to both ends of one of the conductive pad portions 722 on one surface of the substrate part 710, and may be connected to both ends of another of the conductive pad portions 722 on another surface of the substrate part 710, respectively.

According to a preferable aspect of the present disclosure, the core part 730 may be configured as an iron core to thus enhance a magnetic field applied to the coil part 720. This may allow the core part 730 to generate a larger induced voltage than that when the core part 730 is configured as an air core, at the coil part 720. Accordingly, an amplifying circuit for amplifying an induced voltage is not required. For this, the core part 730 may be mounted to the substrate part 710. And the core part 730 may be implemented to have a ring shape. Here, the core part 730 may be inserted into an inner region of the substrate part 710. As FIG. 7 can be referred to, the core part 730 may pass through the first base substrate 711. Though this, the core part 730 may be separated from the conductive pad portions 722 by a boundary of the second base substrates 713, and may be separated from the connection portions 723 by a boundary of the first base substrate 711 and the second base substrates 713.

Figure 9:
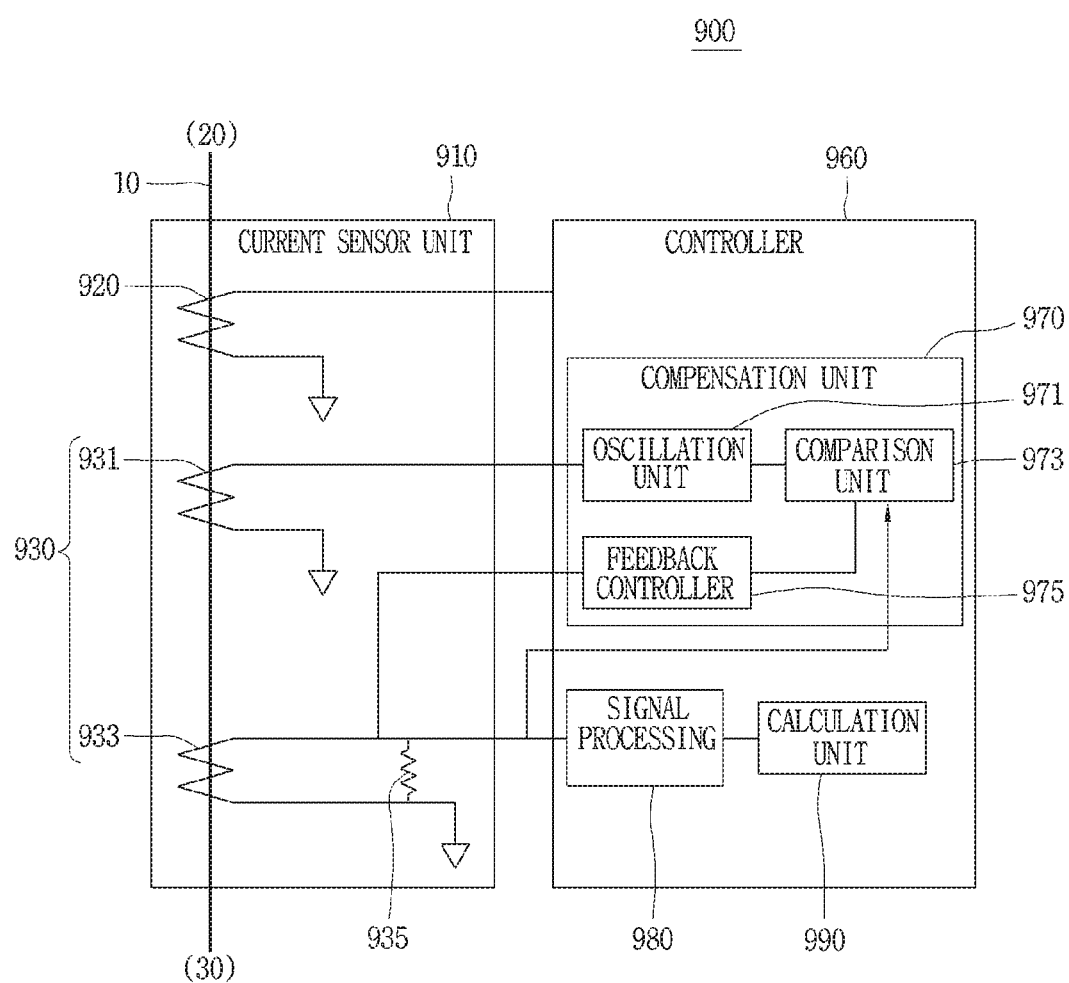
FIG. 9 is a block diagram showing an electric configuration of a current sensing device according to a second embodiment of the present disclosure.

FIG. 9 is a block diagram showing an electric configuration of a current sensing device according to a second embodiment of the present disclosure.

Referring to FIG. 9, a current sensing device 900 according to a second embodiment of the present disclosure may include a current sensor unit 910 and a controller 960. Here, a circuit 10 connects a power source 20 and a load 30, and a current may flow from the power source 20 to the load 30 along the circuit 10. Here, a primary current may be defined as the current flowing on the circuit 10. And a first magnetic field may be defined as a magnetic field generated at the circuit 10, based on the primary current.

The current sensor unit 910 may include a power source unit 920, and a core and PCB coil assembly 930. Here, the power source unit 920 and the core and PCB coil assembly 930 may be stacked on each other by being arranged in parallel to each other in one direction. And the power source unit 920 and the core and PCB coil assembly 930 may pass the circuit 10 therethrough in the one direction. Also, the power source unit 920 and the core and PCB coil assembly 930 may enclose the circuit 10. This may allow a first magnetic field to be applied to the power source unit 920 and the core and PCB coil assembly 930. The power source unit 920 may generate a source current from a first magnetic field, thereby supplying to the controller 960. The core and PCB coil assembly 930 may generate a secondary current by a voltage induced from a first magnetic field. According to the second embodiment, the core and PCB coil assembly 930 may include a first core and PCB coil assembly 931 (hereinafter, will be abbreviated as a first assembly), and a second core and PCB coil assembly 933 (hereinafter, will be abbreviated as a second assembly).

The first assembly 931 may generate a second magnetic field, based on a source current applied from the controller 960. This may allow a part of a first magnetic field to be attenuated by a second magnetic field.

The second assembly 933 may generate a secondary current, based on a current induced by the rest of a first magnetic field and a compensation current applied from the controller 960. The second assembly 933 may include a load 935. The load 935 may provide a voltage formed at both ends of the load 935 to the controller 960, as an input signal for current measurement, in correspondence to the secondary current. Here, the load 935 may be configured as a resistance having a preset resistance value, or a capacitor.

The controller 960 may operate by using a source current of the power source unit 920. And the controller 960 may calculate the amount of a primary current flowing on the circuit 10, based on the secondary current. According to the second embodiment, the controller 960 may include a compensation unit 970, a signal processing unit 980 and a calculation unit 990.

The compensation unit 970 may apply a compensation current to the current sensor unit 910. The compensation unit 970 may include an oscillation unit 971, a comparison unit 973, and a feedback controller 975. The oscillation unit 971 may apply a source current to the first assembly 931.

Here, the oscillation unit 971 may generate a chopping wave or a square wave as the source power having a phase difference of 180° from the primary current flowing on the circuit 10, and may apply it to the first assembly 931. The reason is in order to generate a magnetic field having an opposite direction to a magnetic field formed by the primary current, by the source current, for partial attenuation.

The second magnetic field generated from the first assembly 931 may attenuate the first magnetic field generated by the primary current flowing on the circuit 10, at least partially, by the source current outputted from the oscillation unit 971. Such a partial attenuation may reduce an output voltage of the current sensor unit 910, corresponding to the amount of the primary current flowing on the circuit 10, and thus it is required to compensate for that.

The comparison unit 973 may determine a compensation current to compensate for a part of a first magnetic field. Here, the comparison unit 973 may compare a present output voltage outputted from the current sensor unit 910 to a previous output voltage, thereby determining a corresponding compensation current. Here, the comparison unit 973 may compare a present output voltage outputted from the current sensor unit 910 to a previous output voltage, thereby requesting the feedback controller 975 to output a compensation current corresponding to a difference value between the present output voltage and the previous output voltage.

The feedback controller 975 may apply the corresponding compensation current to the second assembly 933, in response to the request of the comparison unit 973.

The signal processing unit 980 may convert an analogue voltage signal as the output voltage provided from the current sensor unit 910, into a digital signal. Here, the signal processing unit 980 may output the voltage signal converted into the digital signal, to the calculation unit 990.

The calculation unit 990 may calculate the amount of a primary current flowing on the circuit 10, based on the digital signal, the voltage signal. Here, the controller 960 pre-stores therein parameters of the current sensor unit 910, and the calculation unit 990 may output the amount (value) of the primary current by using them. That is, the controller 960 stores therein a voltage value of the digital signal, and the amount of the primary current, in a mapping manner. As the calculation unit 990 selects the primary current corresponding to the voltage value, the calculation may be performed.

Figure 10:
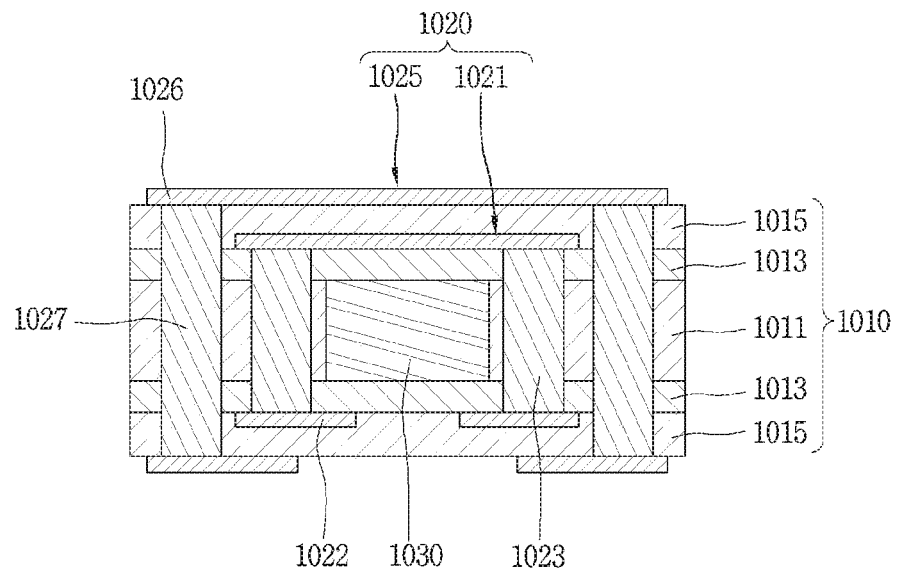
FIG. 10 is a sectional view showing, in a partially-cut manner, an inner configuration of a core and PCB coil assembly among the current sensing device according to a second embodiment of the present disclosure.

FIG. 10 is a sectional view showing an inner configuration of a core and PCB coil assembly 930 according to a second embodiment.

Referring to FIG. 10, the core and PCB coil assembly 930 according to the second embodiment may include a substrate part 1010, a coil part 1020 and a core part 1030.

The substrate part 1010 may support the coil part 1020 and the core part 1030. Here, the substrate part 1010 may include a plurality of base substrates 1011, 1013, 1015. The base substrates 1011, 1013, 1015 may be stacked on each other in one direction. Here, each of the base substrates 1011, 1013, 1015 may be formed to have a flat structure. For instance, each of the base substrates 1011, 1013, 1015 may be formed to have a single layer, or may be formed to have multi layers. The base substrates 1011, 1013, 1015 may include the first base substrate 1011, the second base substrates 1013 mounted to both side surfaces (an upper surface and a bottom surface in FIG. 10) of the first base substrate 1011, and the third base substrates 1015 mounted to the second base substrates 1013, respectively.

The coil part 1020 may generate a secondary current from an applied magnetic field. For this, the coil part 1020 may be mounted to the substrate part 1010. Here, the coil part 1020 may be formed of a conductive material such as copper. The coil part 1020 may include a first coil part 1021 and a second coil part 1025. Here, the first coil part 1021 may serve as the coil part (secondary winding) among the first assembly 931 of FIG. 9, and the second coil part 1025 may serve as the coil part (secondary winding) among the second assembly 933 of FIG. 9.

The first coil part 1021 may include first conductive pad portions 1022 and first connection portions 1023 (first via hole portions). The first conductive pad portions 1022 may be mounted (printed) to (on) the surface of the second base substrate 1013. Here, the first conductive pad portions 1022 may be arranged between the second base substrates 1013 and the third base substrates 1015. The first connection portions 1023 may pass through the first base substrate 1011 and the second base substrates 1013. And the first connection portions 1023 may connect the first conductive pad portions 1022 to each other. For instance, any two of the first connection portions 1023 may be connected to both ends of one of the first conductive pad portions 1022 on one surface (an upper surface in FIG. 10) of the second base substrate 1013 (especially, the upper one of the two second base substrates), and may be connected to both ends of another of the first conductive pad portions 1022 on another surface (a bottom surface in FIG. 10) of the second base substrate 1013 (especially, the lower one of the two second base substrates), respectively.

The second coil part 1025 may include second conductive pad portions 1026 (refer to 722 of FIG. 7 for a detailed configuration), and second connection portions 1027 (refer to 723 of FIG. 7 for a detailed configuration). The second conductive pad portions 1026 may be mounted (printed) to (on) the surface of the third base substrate 1015. The second connection portions 1027 may pass through the first base substrate 1011, the second base substrates 1013, and the third base substrates 1015. And the second connection portions 1027 may connect the second conductive pad portions 1026 to each other. For instance, any two of the second connection portions 1027 may be connected to both ends of one of the second conductive pad portions 1026 on one surface (an upper surface in FIG. 10) of the third base substrate 1015 (the upper one of the two third base substrates in FIG. 10), and may be connected to both ends of another of the second conductive pad portions 1026 on another surface (a bottom surface in FIG. 10) of the third base substrate 1015 (the lower one of the two third base substrates in FIG. 10), respectively.

The core part 1030 may be configured as an iron core to thus enhance a magnetic field applied to the coil part 1020. This may allow the core part 1030 to generate a comparatively larger induced voltage requiring no signal amplification, than that when the core part 1030 is configured as an air core, at the coil part 1020. For this, the core part 1030 may be mounted to the substrate part 1010. And the core part 1030 may be implemented to have a ring shape. Here, the core part 1030 may be inserted into an inner region of the substrate part 1010. The core part 1030 may pass through the first base substrate 1011.

Figure 11:
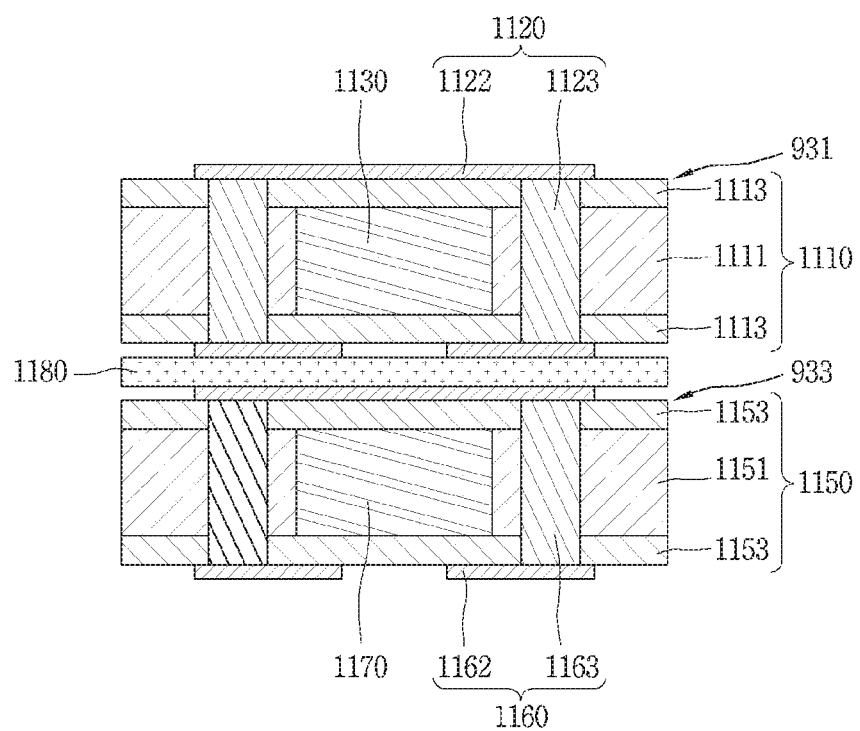
FIG. 11 is a sectional view showing, in a partially-cut manner, an inner configuration of a core and PCB coil assembly among a current sensing device according to a third embodiment of the present disclosure.

FIG. 11 is a sectional view showing a core and PCB coil assembly 930 according to a third embodiment of the present disclosure.

Referring to FIG. 11, the core and PCB coil assembly 930 according to the third embodiment may include a first core and PCB coil assembly 931 (hereinafter, will be abbreviated as a first assembly), and a second core and PCB coil assembly 933 (hereinafter, will be abbreviated as a second assembly). For instance, each of the first assembly 931 and the second assembly 933 may be implemented as a PCB.

The first assembly 931 may include a first substrate part 1110, a first coil part 1120, and a first core part 1130. The first substrate part 1110 may include base substrates 1111, 1113, and the first coil part 1120 may include first conductive pad portions 1122 and first connection portions 1123. The second assembly 933 may include a second substrate part 1150, a second coil part 1160, and a second core part 1170. The second substrate part 1150 may include base substrates 1151, 1153, and the second coil part 1160 may include second conductive pad portions 1162 and second connection portions 1163. Here, the first assembly 931 and the second assembly 933 of the core and PCB coil assembly 930 according to the third embodiment are similar to the core and PCB coil assembly 630 according to the first embodiment, respectively. And thus detailed explanations thereof will be omitted.

A separation part 1180 may be arranged between the first core and PCB coil assembly 931 and the second core and PCB coil assembly 933. And the separation part 1180 may separate the first assembly 931 and the second assembly 933 from each other. Here, according to a preferable aspect, the separation part 1180 may be formed of a material having an electric insulating property.

According to the third embodiment, the core and PCB coil assembly 930 may further include another core part (not shown) and other separation parts (not shown). Another core part may be arranged between the first substrate part 1110 and the second substrate part 1150. Here, the first assembly 931 may not include the first core part 1130, and the second assembly 933 may not include the second core part 1170. Other separation parts may be arranged between the first assembly 931 and another core part, and between another core part and the second assembly 933. Other separation parts may prevent a contact between the first assembly 931 and another core part, and a contact between another core part and the second assembly 933.

An operation of the current sensing device according to the second embodiment shown in FIG. 9 will be explained briefly.

As FIG. 9 can be referred to, a primary current may flow to the load 30 from the power source 20 along the circuit 10. Accordingly, a first magnetic field may be generated around the circuit 10 based on the primary current. Here, the magnetic field may be applied to the power source unit 920 and the core and PCB coil assembly 930, of the current sensor unit 910. The power source unit 920 may supply a source current induced from the first magnetic field, to the controller 960. The controller 960 may apply the source current to the first assembly 931. The first assembly 931 may generate a second magnetic field, based on the source current. This may allow a part of the first magnetic field to be attenuated by the second magnetic field. And the rest of the first magnetic field may be applied to the second assembly 933. The controller 960 may apply a compensation current to compensate for a part of the first magnetic field, to the second assembly 933. This may allow the second assembly 933 to generate a secondary current, based on a current induced by the rest of the first magnetic field and the compensation current. Here, the second assembly 933 may output a voltage corresponding to the secondary current, to the controller 960. This may allow the controller 960 to calculate a primary current based on the voltage.

As aforementioned, according to another embodiment, the core and PCB coil assembly 930 may further include a third core and PCB coil assembly (not shown), and another separation part (not shown). The third core and PCB coil assembly (not shown) may sense one current among an anode and a cathode of a direct current circuit, and the first assembly 931 and the second assembly 933 may sense another current among the anode and the cathode of the direct current circuit. This may allow the current sensor unit 910 of the current sensing device to detect the amount of a current on a direct current circuit. For this, the assembly of the third core and the PCB of coil may include an oscillation circuit. For instance, the assembly of the third core and the PCB of coil may be implemented as a PCB. Here, the assembly of the third core and the PCB of coil may be implemented similarly to the core and PCB coil assembly 630 according to the first embodiment. And the assembly of the third core and the PCB of coil may be stacked on at least one of the first assembly 931 and the second assembly 933. Another separation part may be arranged between at least one of the first assembly 931 and the second assembly 933 and the assembly of the third core and the PCB of coil. And another separation part may separate at least one of the first assembly 931 and the second assembly 933 and the assembly of the third core and the PCB of coil from each other. Here, another separation part may be formed of a material having an electric insulating property.

According to the embodiments of the present disclosure, the core and PCB coil assemblies 230, 630, 930 are fabricated with a structure that the coil parts 420, 720, 1020, 1120, 1160 are printed on the substrate parts 410, 710, 1010, 1110, 1150. Thus, the core and PCB coil assemblies 230, 630, 930 may be automatically fabricated by a manufacturing machine, and the current sensor unit may have uniform characteristics. Here, the core and PCB coil assemblies 230, 630, 930 include the core parts 430, 730, 1030, 1130, 1170 which are configured as iron cores of a high magnetic permeability. Thus, the core parts 430, 730, 1030, 1130, 1170 may enhance a magnetic field applied to the core and PCB coil assemblies 230, 630, 930, from the circuit 10. And a larger induced voltage than that when the core parts are configured as air cores may be obtained. Accordingly, an amplifying circuit for amplifying a current detection signal (a voltage signal finally outputted from the current sensor unit) is not required. And it is easy to separate a current detection signal even if external noise is mixed with the signal. Further, the current sensing devices 100, 600, 900 attenuate a part of a magnetic field generated at the circuit 10, and compensate it by a compensation current, thereby preventing a magnetic saturation.

According to the aforementioned characteristics of the present disclosure, manual procedures may be minimized while the current sensing devices 100, 600, 900 are fabricated, and the current sensing devices 100, 600, 900 may have uniform performances. Accordingly, currents calculated by the current sensing devices 100, 600, 900 may have an enhanced reliability. Further, a malfunction may be prevented when a circuit breaker performs operations, e.g., an operation to monitor and control an electric power circuit, an interruption operation, etc., based on output signals of the current sensing devices 100, 600, 900.

The terms used in this specification are merely used to explain a specific embodiment, which may not intend to limit the scope of another embodiment. A singular representation may include a plural representation unless it represents a definitely different meaning from the context. The terms used here, including technical or scientific terms, may have the same meaning as that understood by those skilled in the technical field disclosed in this specification. The terms defined in a general dictionary, among the terms used in this specification, may be interpreted to have the same or similar meaning as or to a contextual meaning of the relevant technology. And they are not interpreted to have an ideally or excessively formal meaning. In some cases, even the terms defined in this specification should not be interpreted to exclude the embodiments of this specification.

The invention claimed is:

1. A current sensing device for sensing a current flowing on a circuit, comprising:
    a current sensor unit; and
    a controller;
    wherein the current sensor unit comprises:
        a power source unit, and
        a core and PCB coil assembly;
    wherein a circuit passes through the power source unit and the core and PCB coil assembly in one direction;
    wherein a primary current flows through the circuit, causing a first magnetic field to be applied to the power source unit and the core and PCB coil assembly;
    wherein the power source unit generates a source current from the first magnetic field, thereby supplying the source current to the controller;
    wherein the core and PCB coil assembly generates a secondary current by a voltage induced from the first magnetic field;
    wherein the core and PCB coil assembly includes a first assembly and a second assembly,
    wherein the first assembly generates a second magnetic field, based on the source current applied from the controller;
    wherein the second assembly generates the secondary current, based on a current induced by the rest of the first magnetic field and a compensation current applied from the controller;
    wherein the controller calculates an amount of the primary current flowing through the circuit, based on the secondary current;
    wherein the controller comprises:
        a compensation unit to apply a compensation current to the first assembly;
        a signal processing unit to convert an analog voltage signal as the output voltage provided from the second assembly, into a digital signal; and
        a calculation unit to calculate the amount of a primary current flowing on the circuit, based on the digital signal, the voltage signal;
    wherein the core and PCB coil assembly includes a substrate part, a coil part, and a core part;
    wherein the substrate part comprises a first base substrate, second base substrates mounted to both side surfaces of the first base substrate, and third base substrates mounted to the second base substrates, respectively;
    wherein the coil part comprises a first coil part and a second coil part;
    wherein the first coil part is provided in the first assembly, and the second coil part is provided in the second assembly; and
    wherein the core part is inserted into an inner region of the substrate part.

2. The current sensing device of claim 1, further comprising:
    an oscillation unit configured to apply the source current for driving the first coil part.

3. The current sensing device of claim 1, wherein the substrate part includes:
    a first substrate part where the first coil part is formed; and
    a second substrate part stacked on the first substrate part, and where the second coil part is formed.

4. The current sensing device of claim 3,
    wherein the first core part inserted into the first substrate part; and
    the second core part inserted into the second substrate part.

5. The current sensing device of claim 3, wherein the core part is arranged between the first substrate part and the second substrate part.

6. The current sensing device of claim 1, wherein the coil part includes:
    a plurality of conductive pad portions formed on at least two of surfaces of the base substrates defined to be perpendicular to the one direction; and
    a plurality of connection portions configured to connect the conductive pad portions to each other, by passing through at least one of the base substrates in the one direction.

7. The current sensing device of claim 6, wherein the core part is arranged to correspond to an inner region of the conductive pad portions, between both ends of each of the conductive pad portions.

* * * * *